United States Patent [19]

Ramisse et al.

[11] Patent Number: 4,536,327

[45] Date of Patent: Aug. 20, 1985

[54] COMPOSITION FOR PROTECTION AGAINST STRAY CURRENTS AND PROCESS FOR USING THE SAME

[75] Inventors: Yves D. Ramisse; Jean-Pierre C. Baboulet; Michel P. Vié; Paul C. Malaval, all of Gramat, France

[73] Assignee: L'Etat Francais, France

[21] Appl. No.: 271,615

[22] Filed: Jun. 8, 1981

[30] Foreign Application Priority Data

Jun. 13, 1980 [FR] France ................ 80 13138

[51] Int. Cl.³ .............................. H01B 1/06
[52] U.S. Cl. ................... 252/511; 524/495; 524/496
[58] Field of Search ........... 252/511; 524/495, 496, 524/588; 261/212; 174/103, 106 R, 120 R, 115, 119 C; 204/155, 156; 339/DIG. 3

[56] References Cited

U.S. PATENT DOCUMENTS 4,180,642 12/1979 Takago ........................ 524/588
4,279,783 7/1981 Kehrer et al. ................ 524/496
4,387,046 6/1983 Marsch et al. ............... 524/588
4,431,982 2/1984 Monroe et al. ............... 252/511

Primary Examiner—Josephine L. Barr
Attorney, Agent, or Firm—Parkhurst & Oliff

[57] ABSTRACT

The present invention relates to a conductive composition for protecting electric connections from parasitic currents, particularly those due to irradiations of X-ray photons. It comprises a silicone elastomer, preferably of the cold-curing type, mixed with a solvent and filled with fine particles of carbon black forming an electrically homogeneous structure after polymerization. Metallic conductors of electrical connections are thus coated with this composition by means of an apparatus comprising a hermetic housing 1 containing the electrical connection 3 to be coated and connected by an at least partially transparent tube 4 to an impregnation tank 5 at whose outlet a tubular furnace 12 is present, a partial vacuum being applied in the housing and the tube. Application to the protection of electrical connections which are exposed to X-rays is shown in FIG. 1.

14 Claims, 6 Drawing Figures

COMPOSITION FOR PROTECTION AGAINST STRAY CURRENTS AND PROCESS FOR USING THE SAME

The present invention concerns a process for protecting electrical equipment from the effects of parasitic currents due in particular to x-rays. The invention discloses a protective composition having a base of silicone, and an apparatus especially adapted for the carrying out of this process.

Electrical cables, wires and connections which may be exposed to x-rays, particularly in satellites and apparatus which may be used in vacuum, etc., must be protected in view of the disturbances which such irradiations may cause in the operation of the electrical apparatus under such conditions of use. Thus, for instance, when a co-axial cable formed of an outer conductor and an inner conductor which are separated by a dielectric is placed within a stream of X-ray photons, the appearance of an electric current between the two conductors is noted. This current results from the displacement of the charges at the location of the conductor-dielectric interfaces.

A brief but intense irradiation by X-ray photons can cause a current pulse of high amplitude which may mask the signals transmitted in the normal operation of the apparatus, interfere with the operation of the electronic equipment connected to the cables and, in certain cases, completely damage the electronic equipment.

It is known that electric cables can be protected from the effects of irradiation by X-ray photons by forming a conductive layer between the dielectric and the outer conductor. The photoelectrons emitted by a conductor such as an electric cable are relaxed due to the conductivity of the semiconductive layer between the conductor and the dielectric. The relaxation time of the charges $\tau$ is equal to the product RC or the product $\tau\epsilon$ in which:

R is the resistance of the conductive layer
C is the capacitance of the conductive layer
$\rho$ is the resistivity of the conductive layer
$\epsilon$ is the dielectric constant of the conductive layer.

If this charge relaxation time is very short as compared with the duration of the pulse of X-ray photons, everything happens as though the charges were relaxed upon their emission, and under these conditions, there are no induced currents.

It has been proposed to use a conductive layer of polyethylene filled with carbon particles. However, this method does not give satisfactory results since a resistance layer is formed on the surface of the polyethylene and prevents the relaxation of the charges.

Silicone products made conductive by addition of carbon fillers have also been used but such products cannot be used in actual practice due to difficulties in the production thereof and in reproducibility; in particular, during the polymerization of the silicone elastomers, a conductive resistant layer is formed on the surface of the elastomer, which destroys the induction properties of the silicon product.

A conductive silicone product formed of a conductive thixotropic paste filled with particles of carbon black is described in U.S. Pat. No. 3,445,620. However, the use of this product is difficult and there are difficulties in the production and reproducibility thereof.

One of the objects of the invention is therefore to provide a conductive material which has an electrically homogeneous structure after polymerization and which has a very low charge relaxation rate as compared with the duration of the pulse of the X-ray photons.

For this purpose it has been discovered, in accordance with the invention, that a layer of this product should have the following properties:

it must consist solely of light elements and therefore elements of an atomic number close to the atomic number of the elements constituting the dielectric, and, as a matter of fact, the presence of heavy elements would result in a substantial emission of photoelectrons ffrom the conductive layer towards the dielectric and would make the conductive layer inoperative;

all the photoelectrons emitted by the conductors must be stopped within the conductive layer, therefore, the thickness of the conductive layer must be at least equal to the residual path of the photoelectrons of highest energy, and in view of the energy of the photons of interest, the thickness must be on the order of a tenth of a millimeter;

the conductive material must have homogeneous electrical properties throughout the thickness of the layer, therefore, in the case of dielectrics which have been made conductive by the addition of fillers, the diameter of the fillers must be small as compared with the thickness of the layer and the average depth of penetration of the photoelectrons.

The object of the present invention is a method of protecting various electrical cables, connectors and connections having at least one conductor and more particularly at least two conductors separated by a dielectric, which may be subjected to a flow of X-ray photons.

Another object of the invention is a new composition having a base of silicone elastomer made electrically conductive by the addition of fillers and having an electrically homogeneous structure after polymerization, which composition can easily be prepared from products available on the market.

Finally, the invention also has as its object an apparatus which is especially suitable for the carrying out of the method of protecting electrical connections and which makes it possible to apply a homogeneous layer of silicone elastomer in a suitable thickness.

In accordance with the process of the invention, during the course of the making of the electrical connections, at least one homogeneous layer of a silicone elastomer filled with carbon black which is free of surface-resistant layer is formed around the conductor or between the conductors and the dielectric.

In accordance with the preferred manner of carrying out the process of the invention, at least two layers of silicone elastomer filled with particles of carbon black are applied, each layer being placed between the dielectric and one of the conductive layers in a dry thickness of between 0.05 and 0.5 mm.

The process of the invention applies in particular to the protecting of a coaxial cable comprising a central electrical conductor surrounded by a dielectric which in its turn is surrounded by a second electric conductor. In accordance with the invention, a homogeneous layer of silicone filled with particles of carbon black is applied to the central electric conductor whereupon the layer of dielectric and a second layer of silicone filled with particles of carbon black are applied in succession and the second electric conductor is put in place and covered with a protective sheath. An additional layer of filled silicone may be applied between the second electric conductor and the protective sheath.

The new composition of the present invention is formed of a silicone rubber, preferably a cold-curing silicone rubber, made conductive by incorporation of fillers consisting of fine particles of carbon black.

When mineral fillers are introduced in order to make the product conductive, it is found that the consistency of the product increases considerably with the rate of filler. In order to introduce a large amount of filler it is therefore necessary to use a silicone elastomer which is very fluid.

The mixing of the carbon black and silicone elastomer can be effected in accordance with the customary techniques, for instance by means of a roll crusher which makes it possible to obtain a homogeneous dispersion of the particles of carbon black in the silicone. It is important that the size of the particles of carbon black be as small as possible as compared with the thickness of the layer to be applied so that the latter may be perfectly homogeneous. Particles of an average size less than a few microns, and preferably on the order of 0.1 to 0.5 micron, can be used. It is also advantageous for the specific surface of the particles to be large in order to obtain a conductive filled elastomer with a low percentage of filler. The specific surface of the articles of carbon black used in the invention is preferably greater than 500 $m^2/g$.

When using a bicomponent elastomer which can be cured at room temperature, the suitable cross-linking agent is preferably added to the above-described mixture under vaccum in order to eliminate the air which may have entered into the mixture.

The mixture of silicone elastomer and carbon black fillers may be kept for a period of a few days to several months before it is used in accordance with the process of the invention for the protection of electrical connections.

In accordance with the scope of this invention, there is introduced into the mixture a solvent for silicones, for example toluene, xylene, etc., preferably in a proportion of at least 40% by weight, which makes it possible to lower the viscosity of the product. Furthermore, this inhibits the migration of the carbon particles towards the interior since the solvent migrates towards the exterior upon its evaporation and thus entrains the particles. If a conductive mixture without solvent is used, one again notes a thin resistant film on the surface, which is not in accord with the object of the invention.

It may also provide advisable to incorporate a sealer or primer in the mixture in order to facilitate the coating and the adherence of the elastomer to the metallic conductors and the dielectric. As an example, a silane primer.

The protective composition having a base of silicone filled with particles of carbon black in accordance with the invention can be applied by customary means to the components of an electric cable, that is to say to a metal conductor or to a dielectric layer by means of the customary coating apparatus. However, it is preferable to use the apparatus described below, which also falls within the scope of the present invention; in this way, coating with a homogeneous layer can be obtained under good conditions.

The conductive silicone layer applied to the metallic conductor or the dielectric constituting the support is heated to a temperature between about 80° and 250° C. and preferably between 120° C. and 200° C. in order to cause the polymerization of the silicone elastomer, the heating being continued for a period of time on the order of one to several minutes. The dry thickness of the conductive silicone layer must be sufficient to stop the photoelectrons emitted by the conductors without substantially modifying the properties of the cable. Therefore, it should be between about 0.5 mm thick. Too great a thickness may result in defective homogeneity.

The electric conductor may consist of a metal wire or cable of copper, aluminum, an alloy or etc. The dielectric which is interposed between the conductors is generally formed of a material having a base of light elements, for instance teflon or polyethylene, which makes it possible to neglect the displacement of charges due to the photoelectrons emitted by the dielectric itself.

The coating apparatus of the invention comprises a hermetic housing containing the cable to be coated connected to an impregnation tank through which the cable passes and from which it emerges through a calibrating die, as well as a tubular furnace located at the outlet of the tank and a cable drive motor; in accordance with one feature of the invention, the tank and the housing are connected by a tube at least a part of which is transparent, and a partial vacuum is applied in the housing and the tube.

Thus by controlling the rate of flow of mixture of silicone and carbon black introduced into the tank, as well as the speed of passage of the cable and the vacuum in the housing and the tube, the level of the mixture in the tube can be stabilized at a given value.

It is thus possible to improve the quality of the impregnation and the stability of the level in the tube makes it possible to assure conformity and reproducibility of the impregnation conditions.

In accordance with one variant of the invention, a second coating device can be provided consisting of a second impregnation tank located between the first tank and the tubular furnace and traversed by the cable; the two tanks are identical and the enclosure which connects them is connected to a suction pump which makes it possible to establish a partial vacuum in the second tank. It is thus possible to apply two different layers to the cable by placing mixtures of different composition in the tanks.

It may in fact be advantageous to fill the first tank with a mixture of silicone and carbon black without solvent, which produces a first relatively thick layer, while filling the second tank with the same mixture to which solvent has been added so as to obtain a second layer which is less thick but fully homogeneous.

The characteristics and advantages of the invention will be more evident from the preferred embodiments described below, read with reference to the accompanying drawings, in which.

Figure 2:
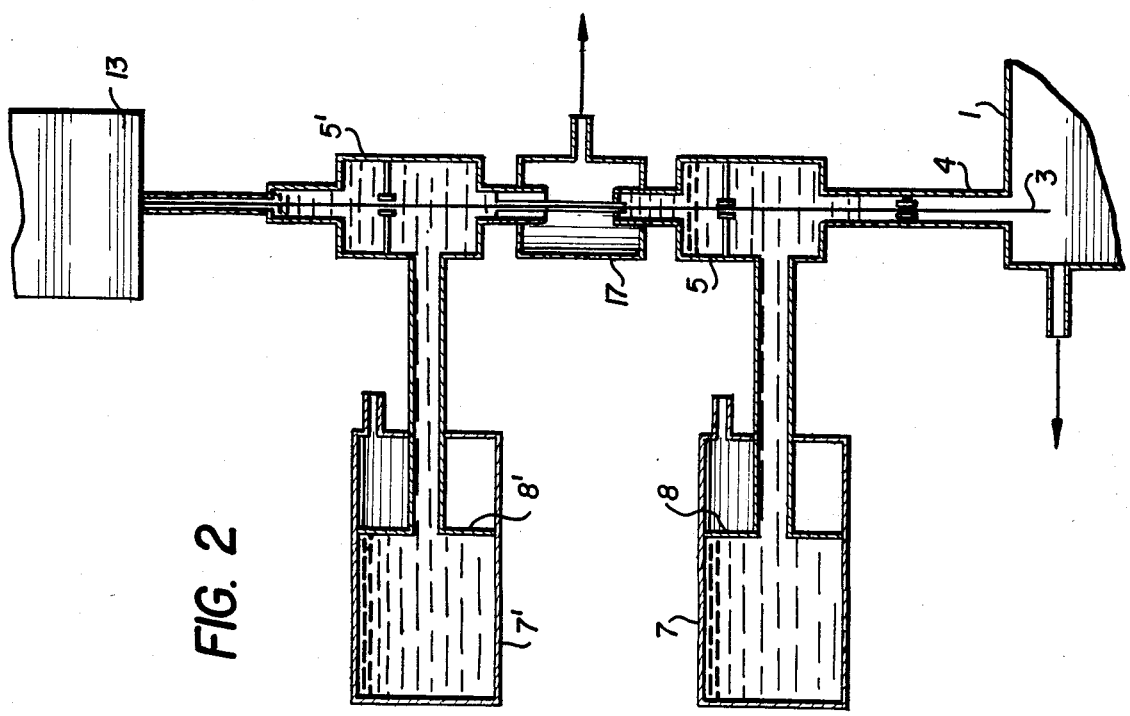
FIG. 2 is a diagrammatic representation of a variant of, partially in cross section, the device shown in FIG. 1.

The silicone-elastomer coating apparatus of the invention comprises a hermetic housing 1 containing a roll 2 of cable to be coated. The cable 3 unwinds and passes through a tube 4 which debouches into an impregnation cell 5 containing the coating mixture 6 formed essentially of the silicone elastomer and particles of carbon black, said mixture being fed from the tank 7 by means of the piston 8 with hollow rod. The positioning of the cable 3 in the impregnation cell 5 is effected by guides 9 and 10. The thickness of the layer applied to the cable is determined by the calibration die 11.

The cable then proceeds into the tubular furnace 12 in which the polymerization of the silicone elastomer takes place. This furnace 12 is formed of a vertically arranged steel tube of a length of 3.3 m heated by helically wound electric resistors. Heat insulation is assured by glass wool and heat probes 13 check the temperature of the furnace which can be adjusted up to 250° C.

Suction means 14 for the drawing off of volatile products such as the solvents used in the preparation of the mixture of silicone and carbon black are provided at the outlet of the furnace 12.

The cable is driven by a variable speed dc motor 15 and is wound onto the receiving roll 16.

The housing 1 for the cable feed roll has an opening 17 which permits connection with a vacuum pump making it possible to apply a partial vacuum within the impregnation cell 5. Thus by controlling the rate of flow of mixture 6 by means of the piston 8 which is driven by compressed air, the speed of passage of the cable by means of the motor 15 and the residual pressure in the hermetic enclosure formed of the housing 1 the tube 4 and the cell 5, it is easily possible to stabilize the level of the mixture 6 in the tube 4, at least a part of which is transparent.

The cable which has thus been covered with a first protective layer of silicone filled with particles of carbon black can be provided with a dielectric layer in accordance with the customary techniques. It is then again placed in the housing 1 in order to receive a second protective layer of silicone filled with carbon black by the same process, before the outer electrical conductor and a protective sheathing are placed on in accordance with the customary techniques.

Figure 1:
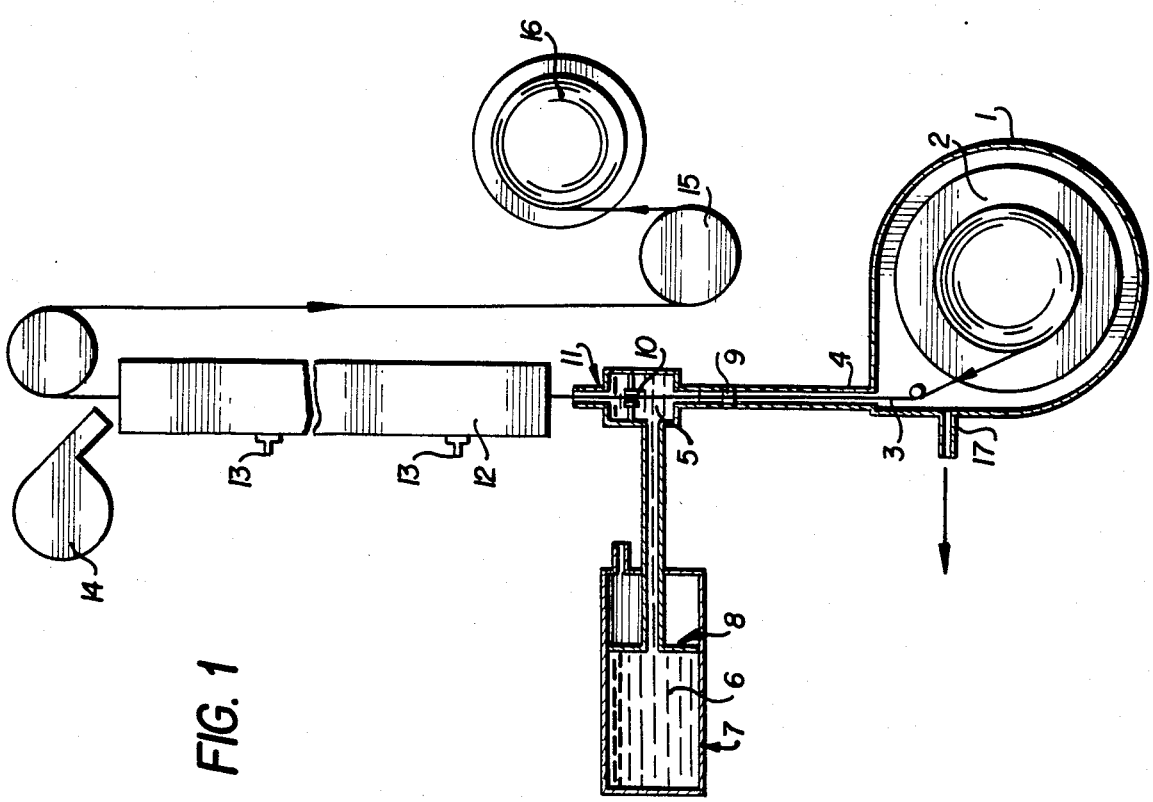
FIG. 1 is a diagrammatic representation of a coating apparatus partially in cross section in accordance with the invention.

In accordance with a variant of the apparatus of the invention which is shown in FIG. 2, a double coating is provided. The housing 1, the tube 4 and the furnace 13 are identical to those shown in FIG. 1, as are the tank 7 and the piston 8. The outlet of the cell 5 is connected to an enclosure 17 within which a partial vacuum is established and which is traversed by the cable 3 which then enters a second cell 5' identical to cell 5 and connected in the same manner to a tank 7' containing a second coating mixture which is delivered into the cell 5' by means of the piston 8'.

This apparatus makes it possible to apply a first coat on the cable with a mixture of silicone and carbon black without solvent, contained within the tank 7, while the tank 7' contains the same mixture but with the addition of a solvent which makes it possible to apply a second thinner but more homogeneous layer over the first coat.

The levels in the two cells 5 and 5' can be controlled independently.

Figure 3:
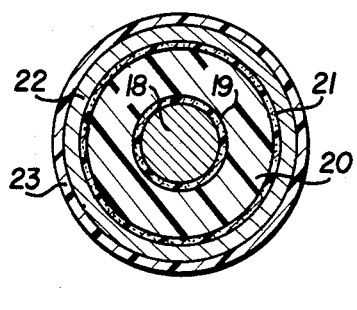
FIG. 3 is a cross section through a coaxial cable having two layers of protective composition of silicone base.

One can thus produce a single-conductor coaxial cable such as shown in FIG. 3 which comprises a central conductor 18 surrounded in succession by a layer 19 of silicone filled with carbon black, a dielectric layer 20, a second layer 21 of silicone filled with carbon black, the outer electric conductor formed of a metal braid 22, and a sheathing 23.

Figure 4:
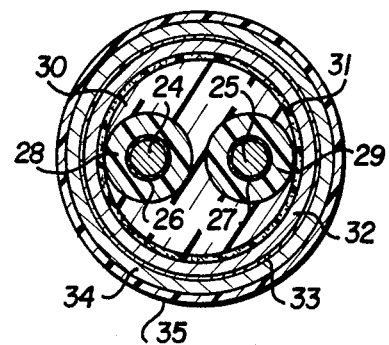
FIG. 4 is a cross section through a two-wire cable protected in accordance with the invention.

FIG. 4 shows a two-wire cable of high radioresistance which comprises two inner conductors 24 and 25 covered by layers 27 of silicone filled with carbon black and by dielectrics 28,29 respectively. The assembly is incorporated in a sheathing 30 of silicone elastomer over which there are applied, one after the other, a layer 31 of silicone filled with carbon black, a first braid 32, a metallic radioresistant tape 33, a second braid 34 and a protective sheating 35.

Figure 5:
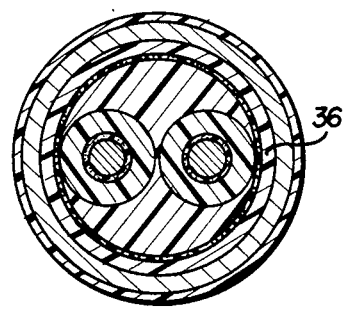
FIG. 5 is a cross section of variant embodiment of the two-wire cable of FIG. 4.

In accordance with the variant two-wire cable protection shown in FIG. 5, an additional layer 36 of silicone filled with carbon black is placed between the first braid 32 and the radioresistant tape 33.

Figure 6:
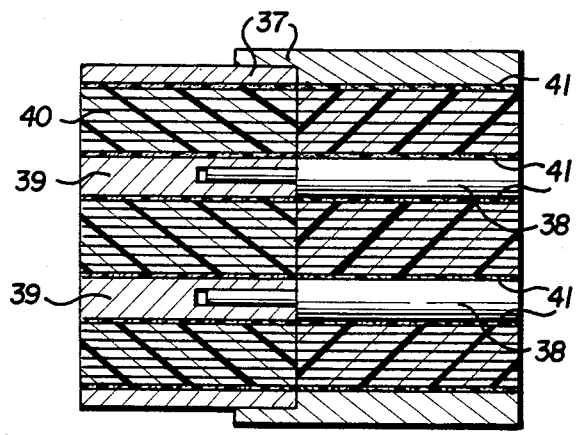
FIG. 6 is a diagrammatic representation of the entire electric connector embodiment which is protected in accordance with the invention.

FIG. 6 diagrammatically shows an electric connector comprising an outer metallic envelope 37 in two parts threaded to each other, male contacts 38 and female contacts 39 assuring the connection, and a dielectric 40. The protection is obtained by means of layers 41 of silicone filled with carbon black applied around the dielectric.

One example of the preparation of the composition having a base of silicone filled with carbon black is given below.

A silicone elastomer RTV 141A which cures at low temperature (Rhone Poulenc) and particles of Ketjenblack EC carbon black (Akzo Chemie) are mixed in a container in the proportions indicated below. The mixing is effected in a three-roll crusher. The product obtained is in the form of a thick grease of a viscosity of about 500,000 poises. The suitable cross-linking agent, RTV 141B (Rhone Poulenc) is then introduced by kneading in an amount of about 10% referred to the weight of RTV 141A, this operation being carried out under vacuum in order to eliminate the air which may have been introduced into the mixture.

In this way there is obtained a mixture of pasty consistency which behaves like a hot-curable elastomer and can be kept at room temperature. The silicone elastomer RTV 141 does not contain any substantial quantities of heavy elements whether in the form of impurities or additives; it therefore contains only base components of silicones which are light elements, namely silicon, oxygen, carbon and hydrogen. The percentage compositions of its two components RTV 141A and RTV 141B are as follows:

|  | % C | % H | % O | % Si |
| --- | --- | --- | --- | --- |
| RTV 141A | 29.4 | 7.3 | 24.7 | 38.6 |
| RTV 141B | 27.05 | 7.25 | 24.75 | 40.95 |

The KETJENBLACK carbon black has a content of impurities of 0.02% by weight, the size of the particles forming it is 0.03 micron, and their specific surface is 1000 m²/g.

By mixing under partial vacuum (100 to 200 mmHg), toluene in order to lower the viscosity of the product and eliminate the surface resistance effect after polymerization, and silane is added as primer. The composition is then ready for use and is of high thixotropy in view of the large specific surface of the fillers of carbon black; its viscosity is about 26,000 centipoises.

| Composition | |
|---|---|
| silicone RTV 141A | 100 parts by weight |
| cross-linking agent RTF 141B | 10 parts by weight |
| Ketjenblack EC carbon black | 10 parts by weight |
| toluene | 120 parts by weight |
| silane 3172 | 1 part by weight |

This material makes it possible to relax the charges emitted by the cable conductors towards the dielectric under the effect of X-ray photons and to thus minimize the parasitic signals induced since it has a relaxation rate of less than 1 nanosecond.

As a matter of fact, using as test sample a coaxial cable containing this composite material as dielectric, its electrical properties were determined as a function of the frequency (resistivity $\rho$, permittivity $\epsilon$, relaxation time $\tau$) on basis of the results of the measurement of the impedance of the cable.

The following satisfactory results are obtained:

| frequency (MHz) | 4 | 50 | 100 | 150 | 200 | 250 | 300 | 350 | 400 | 450 |
|---|---|---|---|---|---|---|---|---|---|---|
| relaxation time (picoseconds) | 5 | 18 | 37 | 62 | 74 | 80 | 85 | 80 | 70 | 55 |

The conductivity of the composition can be varied by modifying the amounts of carbon black added, as indicated in the following table:

| concentration of carbon black filler | conductivity ($\Omega \cdot m$) |
|---|---|
| 5 parts by weight | 1.163 |
| 8 parts by weight | 0.16 |
| 10 parts by weight | 0.214 |
| 12 parts by weight | 0.06 |
| 15 parts by weight | 0.06 |

The composition can easily be determined as a function of the conditions of use and the effects desired.

The conductive composition of the invention can be applied for protection from other parasitic currents, for instance, from the Corona effect appearing in electric transmission cables of very high voltage, or from the stray currents appearing in electric cables of low crosstalk such as telephone cables.

We claim:

1. A composition for protecting electric cables, connectors, and connections, from parasitic currents, namely, noise currents from irradiation and X-ray photon pulses, comprising:
   (a) a cold-curing silicone rubber of a viscosity of less than 10,000 centipoises;
   (b) a filler of fine particles of carbon black of sizes of less than 1 micron in a percentage of 2 to 6% by weight, the fine filler carbon black particles having a specific surface of greater than 500 m²/g; and
   (c) a solvent for the silicone in a percentage of at least 40% by weight.

2. A composition according to claim 1, wherein said cold-curing silicone rubber has a viscosity of 3,000 centipoises and is formed of a first principal component in a proportion of about 90% and a cross-linking agent in a proportion of about 10%, the percentage compositions of the two components being from about 27 to 30% carbon, about 7% hydrogen, about 25% oxygen, and about 38 to 41% silicon.

3. A composition according to claim 2, wherein said carbon black particles have a specific surface of 1000 m²/g, and a concentration of impurities of less than 0.02% by weight.

4. A process of protecting electric connections from parasitic currents comprising the steps of separating at least two electric conductors and applying at least one homogeneous layer of a composition formed of a cold-curing silicone rubber of a viscosity of less than 10,000 centipoises, a filler of fine particles of carbon black of sizes of less than 1 micron in a percentage of 2 to 6% by weight, and a solvent for the silicone in a percentage of at least 40% by weight.

5. A process according to claim 4, wherein at least one layer of said composition is applied to each conductor-dielectric interface.

6. A process according to claim 5, wherein at least one additional layer of said composition is applied to the outer face of the outer conductor.

7. A process as recited in any of claims 4, 5 or 6, wherein said cold-curing silicone rubber has of a viscosity of 3,000 centipoises and is formed of a first principal component in a proportion of about 90% and a cross-linking agent in a proportion of about 10%, the percentage compositions of the two components being from about 27 to 30% carbon, about 7% hydrogen, about 25% oxygen, and about 38 to 41% silicon.

8. A process according to claim 7, wherein said solvent for the silicones is selected from the group consisting of toluene and xylene.

9. A process according to claim 8, wherein said composition is applied to a conductor or a dielectric in a thickness of between 0.05 and 0.5 mm.

10. A process according to claim 8, wherein said composition is applied to a conductor and a dielectric in a thickness of between 0.05 and 0.5 mm.

11. A process as recited in claim 8, wherein said carbon black particles have a specific surface of greater than 500 m²/g.

12. A process as recited in claim 10 wherein said carbon black particles have a specific surface of greater than 500 m²/g.

13. A process as recited in claim 11 wherein said carbon black particles have a specific surface of 100 m²/g, and a concentration of impurities of less than 0.02% by weight.

14. A process as recited in claim 12 wherein said carbon black particles have a specific surface of 100 m²/g and a concentration of impurities of less than 0.02% by weight.

* * * * *